United States Patent
Cho et al.

(10) Patent No.: US 10,002,984 B2
(45) Date of Patent: Jun. 19, 2018

(54) SOLAR CELL PANEL

(71) Applicant: LG ELECTRONICS INC., Seoul (KR)

(72) Inventors: Yunhui Cho, Seoul (KR); Wondoo Song, Seoul (KR); Dukgyu Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 140 days.

(21) Appl. No.: 15/229,883

(22) Filed: Aug. 5, 2016

(65) Prior Publication Data

US 2017/0040481 A1    Feb. 9, 2017

(30) Foreign Application Priority Data

Aug. 7, 2015   (KR) .................... 10-2015-0111715

(51) Int. Cl.
*H01L 31/042*  (2014.01)
*H02N 6/00*    (2006.01)
*H01L 31/05*   (2014.01)
*H01L 31/0236* (2006.01)

(52) U.S. Cl.
CPC .... *H01L 31/0508* (2013.01); *H01L 31/02366* (2013.01); *Y02E 10/50* (2013.01)

(58) Field of Classification Search
CPC ........... H01L 31/0508; H01L 31/02366; Y02E 10/50
USPC ........................................................ 136/244
See application file for complete search history.

(56) References Cited

U.S. PATENT DOCUMENTS

| 2009/0277491 A1 | 11/2009 | Nakamura et al. |
| 2010/0108122 A1* | 5/2010 | Everson ............... H01L 24/33 136/246 |
| 2011/0297224 A1 | 12/2011 | Miyamoto et al. |
| 2011/0315188 A1* | 12/2011 | Hong ............... H01L 31/0512 136/244 |
| 2012/0042924 A1* | 2/2012 | Lee ............... H01L 31/02013 136/244 |
| 2013/0025673 A1 | 1/2013 | Huebel et al. |
| 2015/0090334 A1 | 4/2015 | Han et al. |

FOREIGN PATENT DOCUMENTS

| EP | 2 348 539 A1 | 7/2011 |
| JP | 2007-287749 A | 11/2007 |
| JP | 2011-49514 A | 3/2011 |
| JP | 2014-103300 A | 6/2014 |

(Continued)

OTHER PUBLICATIONS

English machine translation of JP 2014-165504 A (Year: 2014).*

*Primary Examiner* — Angelo Trivisonno
(74) *Attorney, Agent, or Firm* — Birch, Stewart, Kolasch & Birch, LLP

(57) ABSTRACT

Disclosed is a solar cell panel including a plurality of solar cells each including a semiconductor substrate and an electrode formed on the semiconductor substrate, and a wire for interconnecting the solar cells. The electrode includes a bus-bar line having a pad portion for attachment of the wire. The wire includes a first wire portion connected to the pad portion, and a second wire portion located on a portion excluding the pad portion. The first wire portion has a thickness greater than a thickness of the second wire portion.

20 Claims, 6 Drawing Sheets

(56) References Cited

FOREIGN PATENT DOCUMENTS

| JP | 2014165504 A | * | 9/2014 | ......... H01L 31/0508 |
|----|--------------|---|--------|------------------------|
| KR | 10-2015-0035190 A | | 4/2015 | |
| KR | 10-1542002 B1 | | 8/2015 | |

* cited by examiner

SOLAR CELL PANEL

CROSS-REFERENCE TO RELATED APPLICATION

This application claims the priority benefit of Korean Patent Application No. 10-2015-0111715, filed on Aug. 7, 2015 in the Korean Intellectual Property Office, the disclosure of which is incorporated herein by reference.

BACKGROUND OF THE INVENTION

Field of the Invention

The present inventive concept relates to a solar cell panel, and more particularly, to a solar cell panel having an improved connection structure.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

A plurality of solar cells is connected to each other in series or in parallel using ribbons, and is manufactured into a solar cell panel via packaging, which is a process for protecting the solar cells. Because the solar cell panel needs to perform electricity generation for a long term in various environments, considerable long-term reliability is required. At this time, the solar cells are connected to one another using the ribbons in the related art.

However, when the solar cells are connected to one another using the ribbons having a large width of approximately 1.5 mm, for example, shading loss may occur due to the large width of the ribbons. Therefore, the number of the ribbons provided on the solar cells should be reduced. In addition, the strength of attachment of the ribbons may not be good, or the degree of bending of the solar cells may be increased by the ribbons. Thereby, increase in the output of the solar cell panel may be limited, and the reliability of the solar cell panel may be deteriorated when the ribbons are separated or when the solar cells are damaged.

SUMMARY OF THE INVENTION

Therefore, the present inventive concept has been made in view of the above problems, and it is an object of the present inventive concept to provide a solar cell panel capable of increasing the output and the reliability thereof.

According to an aspect of the present inventive concept, the above and other objects can be accomplished by the provision of a solar cell panel including a plurality of solar cells each including a semiconductor substrate and an electrode formed on the semiconductor substrate, and a wire for interconnecting the solar cells. The electrode includes a bus-bar line having a pad portion for attachment of the wire. The wire includes a first wire portion connected to the pad portion, and a second wire portion located on a portion excluding the pad portion. The first wire portion has a thickness greater than a thickness of the second wire portion.

BRIEF DESCRIPTION OF THE DRAWINGS

The above and other objects, features and other advantages of the present inventive concept will be more clearly understood from the following detailed description taken in conjunction with the accompanying drawings, in which.

DETAILED DESCRIPTION OF THE EMBODIMENTS

Figure 1:
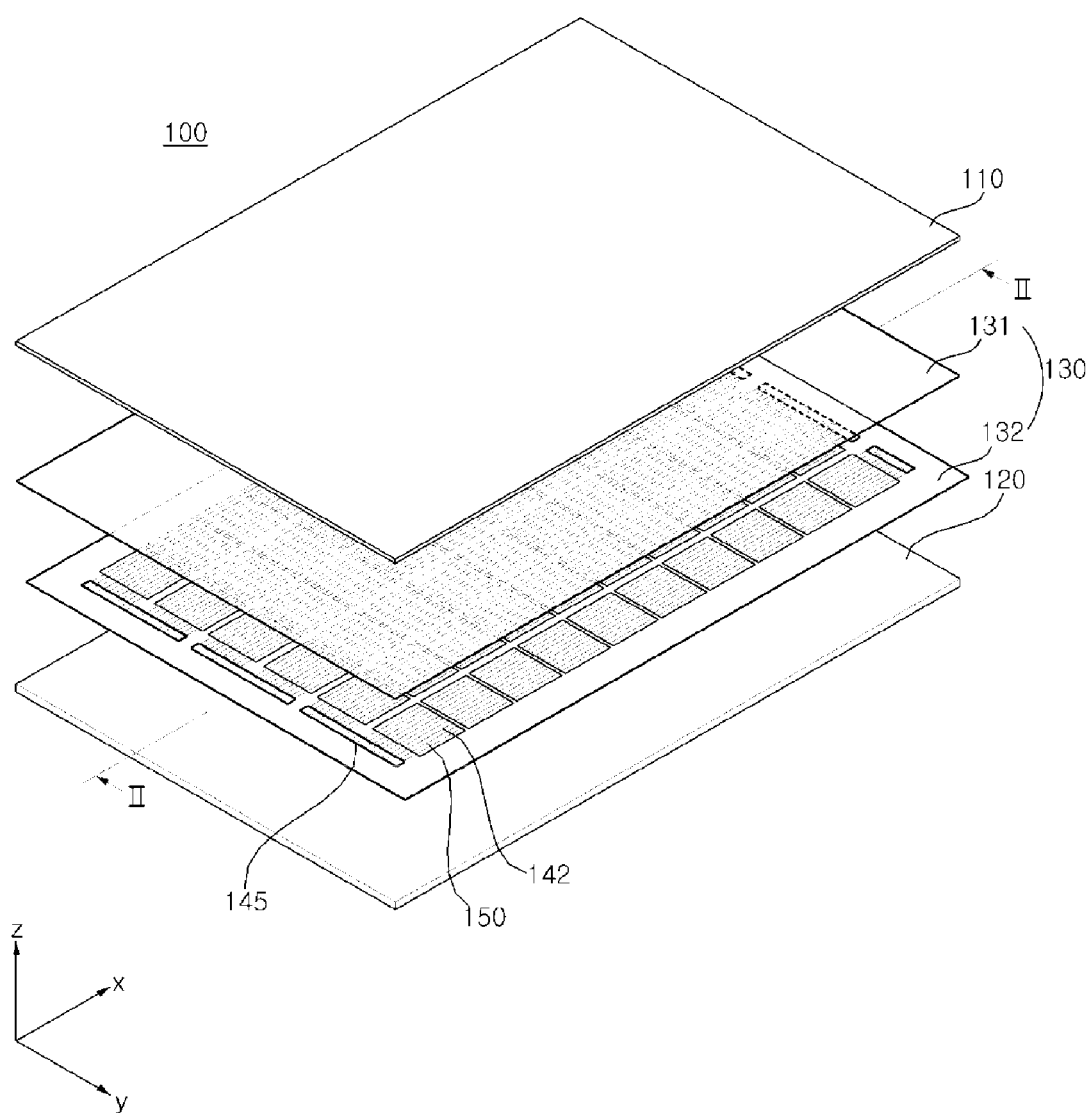
FIG. 1 is a perspective view illustrating a solar cell panel according to an embodiment of the present inventive concept.

Reference will now be made in detail to the embodiments of the present inventive concept, examples of which are illustrated in the accompanying drawings. However, it will be understood that the present inventive concept should not be limited to the embodiments and may be modified in various ways.

In the drawings, to clearly and briefly explain the present inventive concept, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the present inventive concept are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being on another element, it can be directly on the other element or intervening elements may also be present. On the other hand, when an element such as a layer, film, region or substrate is referred to as being "directly on" another element, this means that there are no intervening elements therebetween.

Hereinafter, a solar cell panel according to an embodiment of the present inventive concept will be described in detail with reference to the accompanying drawings. Here, the terms "first", "second", etc. are simply used in order to distinguish elements from each other, and the present inventive concept is not limited thereto.

Figure 2:
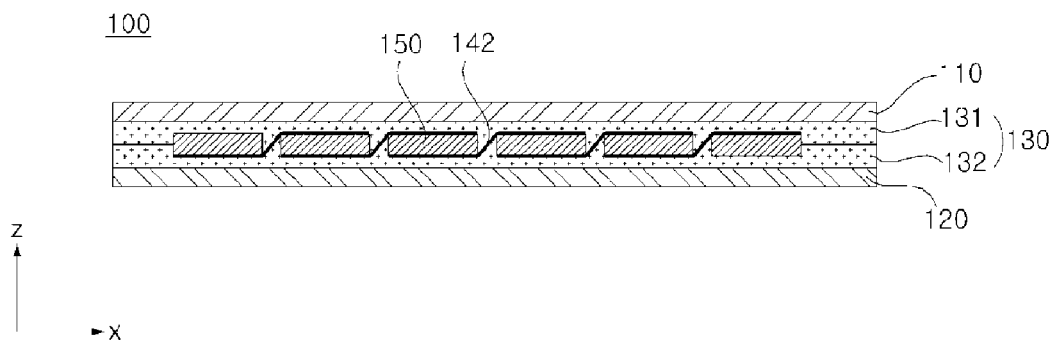
FIG. 2 is a sectional view taken along line II-II of FIG. 1.

FIG. 1 is a perspective view illustrating a solar cell panel according to an embodiment of the present inventive concept, and FIG. 2 is a sectional view taken along line II-II of FIG. 1.

Referring to FIGS. 1 and 2, the solar cell panel according to the present embodiment, designated by reference numeral 100, includes a plurality of solar cells 150, and wires 142 for electrically interconnecting the solar cells 150. Further, the solar cell panel 100 includes a sealing member 130 for surrounding and sealing the solar cells 150 and the wires 142 for interconnecting the same, a front substrate 110 disposed on the front surface of the solar cells 150 above the sealing member 130, and a back substrate 120 disposed on the back surface of the solar cells 150 above the sealing member 130. This will be described below in more detail.

First, each of the solar cells 150 may include a photoelectric converter for converting sunlight into electrical energy, and an electrode electrically connected to the photoelectric converter for collecting and transmitting current. In addition, the solar cells 150 may be electrically interconnected in series and/or in parallel by the wires 142. Specifically, each wire 142 electrically interconnects two neighboring solar cells 150 among the solar cells 150.

In addition, bus ribbons 145 interconnect alternate ends of the wires 142, which connect the solar cells 150 to one another in rows (in other words, constituting solar cell strings). The bus ribbons 145 may be located on the ends of the solar cell strings so as to cross the solar cell strings. The bus ribbons 145 may interconnect the solar cell strings adjacent to each other, or may connect the solar cell string(s) to a junction box (not illustrated), which prevents the backflow of current. The material, shape, connection structure, and the like of the bus ribbons 145 may be altered in various ways, and the present inventive concept is not limited as to them.

The sealing member 130 may include a first sealing member 131 disposed on the front surface of the solar cells 150 interconnected by the wires 142, and a second sealing member 132 disposed on the back surface of the solar cells 150. The first sealing member 131 and the second sealing member 132 prevent the introduction of moisture and oxygen, and realize a chemical bond between respective elements of the solar cell panel 100. The first and second sealing members 131 and 132 may be formed of an insulation material having light-transmissive and adhesive properties. In one example, the first sealing member 131 and the second sealing member 132 may be formed of ethylene vinyl acetate (EVA) copolymer resin, polyvinyl butyral, silicone resin, ester-based resin, or olefin-based resin. Through, for example, a lamination process using the first and second sealing members 131 and 132, the back substrate 120, the second sealing member 132, the solar cells 150, the first sealing member 131, and the front substrate 110 may be integrated with one another so as to construct the solar cell panel 100.

The front substrate 110 is disposed on the first sealing member 131 and configures the front surface of the solar cell panel 100. The back substrate 120 is disposed on the second sealing member 132 and configures the back surface of the solar cell panel 100. Each of the front substrate 110 and the back substrate 120 may be formed of an insulation material capable of protecting the solar cells 150 from external shocks, moisture, ultraviolet light, and the like. In addition, the front substrate 110 may be formed of a light-transmitting material capable of transmitting light, and the back substrate 120 may be configured as a sheet formed of a light-transmitting material, a material not transmitting light, or a material reflecting light. In one example, the front substrate 110 may be configured as a glass substrate, and the back substrate 120 may be a Tedlar/PET/Tedlar (TPT) substrate, or may include a polyvinylidene fluoride (PVDF) resin layer formed on at least one surface of a base film (e.g. a polyethyleneterephthlate (PET) film).

However, the present inventive concept is not limited thereto. Thus, the first and second sealing members 131 and 132, the front substrate 110, or the back substrate 120 may include any of various materials excluding the above-described materials, and may have any of various shapes. For example, the front substrate 110 or the back substrate 120 may have any of various shapes (e.g. a substrate, film, or sheet), or may include any of various materials.

One example of the solar cell and the wires connected thereto, which are included in the solar cell panel according to the embodiment of the present inventive concept, will be described below in more detail with reference to FIG. 3.

Figure 3:
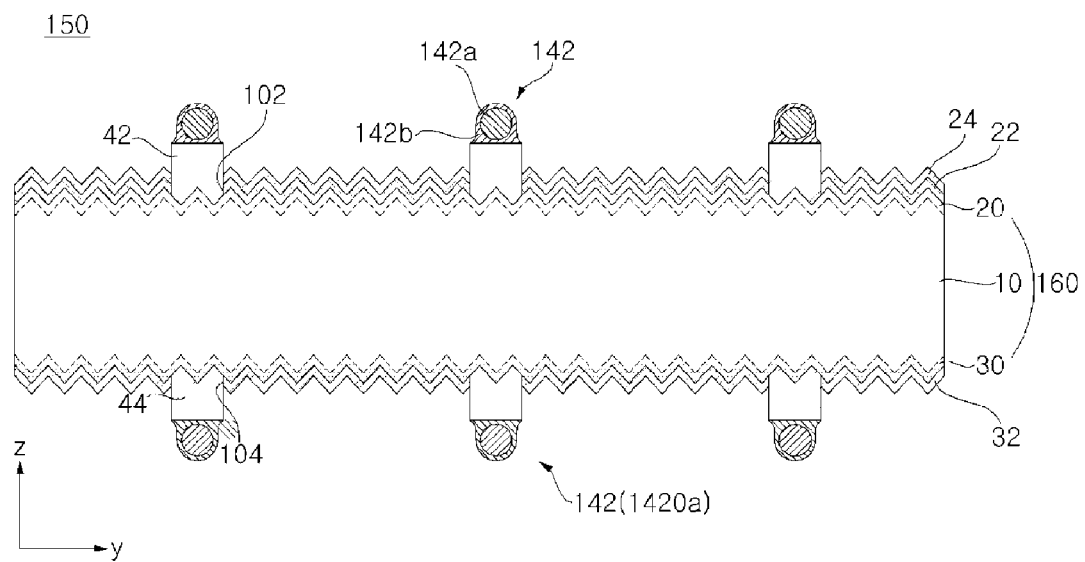
FIG. 3 is a partial sectional view illustrating one example of a solar cell and wires connected thereto, which are included in the solar cell panel of FIG. 1.

FIG. 3 is a partial sectional view illustrating one example of the solar cell and the wires connected thereto, which are included in the solar cell panel of FIG. 1.

Referring to FIG. 3, each solar cell 150 includes a semiconductor substrate 160, conductive areas 20 and 30 formed on or over the semiconductor substrate 160, and electrodes 42 and 44 connected to the conductive areas 20 and 30. The conductive areas 20 and 30 may include a first conductive area 20 of a first conductive type and a second conductive area 30 of a second conductive type. The electrodes 42 and 44 may include a first electrode 42 connected to the first conductive area 20 and a second electrode 44 connected to the second conductive area 30. The solar cell 150 may further include, for example, first and second passivation films 22 and 32, and an anti-reflection film 24.

The semiconductor substrate 160 may be formed of crystalline semiconductors including a single semiconductor material (e.g. group-IV elements). In one example, the semiconductor substrate 160 may be formed of monocrystalline or polycrystalline semiconductors (e.g. monocrystalline or polycrystalline silicon). More particularly, the semiconductor substrate 160 may be formed of monocrystalline semiconductors (e.g. a monocrystalline semiconductor wafer, and more specifically, a monocrystalline silicon wafer). Then, the solar cell 150 is based on the semiconductor substrate 160, which is formed of monocrystalline semiconductors having high crystallinity and thus low defects. Accordingly, the solar cell 150 may have excellent electrical properties.

The front surface and/or the back surface of the semiconductor substrate 160 may be subjected to texturing so as to have protrusions. The protrusions may have a pyramidal shape having irregular sizes, and the outer surface of the protrusions may be (111) faces of the semiconductor substrate 160. When the roughness of the front surface of the semiconductor substrate 160 is increased by the protrusions formed on the front surface via texturing, the reflectance of light introduced through the front surface of the semiconductor substrate 160 may be reduced. Accordingly, the quantity of light, which reaches the pn junction formed by a base area 10 and the first or second conductive area 20 or 30, may be increased, which may minimize shading loss. The present embodiment illustrates that protrusions are formed on each of the front surface and the back surface of the semiconductor substrate 160. However, the present inventive concept is not limited thereto. Accordingly, protrusions may be formed on at least one of the back surface and the front surface of the semiconductor substrate 160, and may not be formed on the front surface and the back surface of the semiconductor substrate 160.

In the present embodiment, the semiconductor substrate 160 may include the base area 10, which includes a first or second conductive dopant at a relatively low doping density, thus being of a first or second conductive type. At this time, the base area 10 of the semiconductor substrate 160 may have a lower doping density, higher resistance, or lower carrier density than one of the first and second conductive areas 20 and 30, which is of the same conductive type as the base area 10. In one example, in the present embodiment, the base area 10 may be of the second conductive type.

In addition, the semiconductor substrate 160 may include the first conductive area 20 and the second conductive area 30. In the present embodiment, the base area 10 and the conductive areas 20 and 30, which constitute the semiconductor substrate 160, have the crystalline structure of the semiconductor substrate 160, are of different conductive types, and have different doping densities. For example, an area of the semiconductor substrate 160, which includes a first conductive dopant and thus is of a first conductive type, may be defined as the first conductive area 20, an area of the semiconductor substrate 160, which includes a second conductive dopant at a low doping density and thus is of a second conductive type, may be defined as the base area 10, and an area of the semiconductor substrate 160, which includes the second conductive dopant at a higher doping density than that in the base area 10 and thus is of the second conductive type, may be defined as the second conductive area 30.

The first and second conductive areas 20 and 30 may be formed respectively throughout the front surface and the back surface of the semiconductor substrate 160. Here, "formed throughout" includes not only physically complete formation, but also formation with inevitably excluded parts. In this way, the first and second conductive areas 20 and 30 may be formed to have a sufficient area without separate patterning.

The first conductive area 20 may configure an emitter area, which forms a pn junction with the base area 10. The second conductive area 30 may configure a back-surface field area, which forms a back-surface field. The back-surface field area serves to prevent the loss of carriers due to recombination on the surface of the semiconductor substrate 160 (more accurately, the back surface of the semiconductor substrate 160).

In the present embodiment, the conductive areas 20 and 30 are doped areas, which are formed by doping some inner areas of the semiconductor substrate 160 with dopants, thus constituting a portion of the semiconductor substrate 160. However, the present inventive concept is not limited thereto. Accordingly, at least one of the first conductive area 20 and the second conductive area 30 may be configured as an amorphous, microcrystalline or polycrystalline semiconductor layer, which is a separate layer over the semiconductor substrate 160. Various alterations are possible.

In addition, the present embodiment exemplifies that the first conductive area 20 and the second conductive area 30 have a homogeneous structure having a uniform doping density. However, the present inventive concept is not limited thereto. Thus, in another embodiment, at least one of the first conductive area 20 and the second conductive area 30 may have a selective structure. In the selective structure, a portion of the conductive areas 20 and 30 proximate to the electrodes 42 and 44 may have a high doping density and low resistance, and the remaining portion may have a low doping density and high resistance. In another embodiment, the second conductive area 30 may have a local structure. In the local structure, the second conductive area 30 may be locally formed so as to correspond to a portion of the second electrode 44.

The first conductive dopant, included in the first conductive area 20, may be an n-type or p-type dopant, and the second conductive dopant, included in the base area 10 and the second conductive area 30, may be a p-type or n-type dopant. The p-type dopant may be a group-III element, such as boron (B), aluminum (Al), gallium (ga), or indium (In), and the n-type dopant may be a group-V element, such as phosphorus (P), arsenic (As), bismuth (Bi), or antimony (Sb). The second conductive dopant in the base area 10 and the second conductive dopant in the second conductive area 30 may be the same material, or may be different materials.

In one example, the first conductive area 20 may be of a p-type, and the base area 10 and the second conductive area may be of an n-type. When light is emitted to the pn junction formed by the first conductive area 20 and the base area 10, electrons generated by photoelectric conversion move to the back surface of the semiconductor substrate 160 to thereby be collected by the second electrode 44, and holes move to the front surface of the semiconductor substrate 160 to thereby be collected by the first electrode 42. Thereby, electricity is generated. When holes, which move more slowly than electrons, move to the front surface of the semiconductor substrate 160, rather than the back surface, the conversion efficiency may be improved. However, the present inventive concept is not limited thereto, and the base area 10 and the second conductive area 30 may be of a p-type, and the first conductive area 20 may be of an n-type.

Insulation films, such as the first and second passivation films 22 and 32 and the anti-reflection film 24, may be formed over the surfaces of the semiconductor substrate 160. The insulation films may be configured as undoped insulation films, which include no dopant.

More specifically, the first passivation film 22 may be formed over (e.g. in contact with) the front surface of the semiconductor substrate 160, more accurately, over the first conductive area 20 formed on the semiconductor substrate 160, and the anti-reflection film 24 may be formed over (e.g. in contact with) the first passivation film 22. In addition, the second passivation film 32 may be formed over (e.g. in contact with) the back surface of the semiconductor substrate 160, more accurately, over the second conductive area 30 formed on the semiconductor substrate 160.

The first passivation film 22 and the anti-reflection film 24 may substantially be formed throughout the front surface of the semiconductor substrate 160 excluding a portion corresponding to the first electrode 42 (more accurately, a portion provided with a first opening 102). Similarly, the second passivation film 32 may substantially be formed throughout the back surface of the semiconductor substrate 160 excluding a portion corresponding to the second electrode 44 (more accurately, a portion provided with a second opening 104).

The first and second passivation films 22 and 32 come into contact with the first and second conductive areas 20 and 30 for passivation of defects present in the surface or the bulk of the conductive areas 20 and 30. As such, it is possible to increase the open-circuit voltage Voc of the solar cell 150 by removing recombination sites of minority carriers. The anti-reflection film 24 reduces the reflectance of light introduced into the front surface of the semiconductor substrate 160. This may increase the quantity of light, which reaches the pn junction formed at the interface of the base area 10 and the first conductive area 20. Thereby, the short-circuit current Isc of the solar cell 150 may be increased. In conclusion, the passivation films 22 and 32 and the anti-reflection film 24 may increase the open-circuit voltage and the short-circuit current of the solar cell 150, thereby improving the efficiency of the solar cell 150.

In one example, the passivation films 22 and 32 or the anti-reflection film 24 may include a single film or multiple films in the form of a combination of two or more films selected from the group consisting of a silicon nitride film, silicon nitride film containing hydrogen, silicon oxide film, silicon oxide nitride film, aluminum oxide film, $MgF_2$, ZnS, $TiO_2$, and $CeO_2$. In one example, the first or second passivation film 22 or 32 may include a silicon oxide film or silicon nitride film having a fixed positive charge when the conductive areas 20 and 30 are of an n-type, and may include an aluminum oxide film having a fixed negative charge when the conductive areas 20 and 30 are of a p-type. In one example, the anti-reflection film 24 may include a silicon nitride.

However, the present inventive concept is not limited thereto, and the passivation films 22 and 32 and the anti-reflection film 24 may include various materials. In addition, the stacking structure of the insulation films stacked over the front surface and/or the back surface of the semiconductor substrate 160 may be altered in various ways. For example, the insulation films may be stacked one above another in a stacking sequence different from the above-described stacking sequence. Alternatively, at least one of the first and second passivation films 22 and 32 and the anti-reflection film 24 may be omitted, or other insulation films excluding the first and second passivation films 22 and 32 and the anti-reflection film 24 may be provided. Various other alterations are possible.

The first electrode 42 is electrically connected to the first conductive area 20 through the first opening 102, which is formed in the insulation films disposed on the front surface of the semiconductor substrate 160 (e.g. the first passivation film 22 and the anti-reflection film 24). The second electrode 44 is electrically connected to the second conductive area 30 through the second opening 104, which is formed in the insulation film disposed on the back surface of the semiconductor substrate 160 (e.g. the second passivation film 32). In one example, the first electrode 42 may come into contact with the first conductive area 20, and the second electrode 44 may come into contact with the second conductive area 30.

The first and second electrodes 42 and 44 may be formed of various materials (e.g. metal materials) so as to have various shapes. The shapes of the first and second electrodes 42 and 44 will be described later.

As such, in the present embodiment, the first and second electrodes 42 of the solar cell 150 may have a given pattern so that the solar cell 150 has a bi-facial structure to allow light to be introduced into the front surface and the back surface of the semiconductor substrate 160. Thereby, the quantity of light used in the solar cell 150 may be increased, which may contribute to improvement in the efficiency of the solar cell 150.

However, the present inventive concept is not limited thereto, and the second electrode 44 may be formed throughout the back surface of the semiconductor substrate 160. In addition, all of the first and second conductive areas 20 and and the first and second electrodes 42 and 44 may be arranged on the same surface (e.g. the back surface) of the semiconductor substrate 160, or at least one of the first and second conductive areas 20 and 30 may be formed over both the surfaces of the semiconductor substrate 160. That is, the above-described solar cell 150 is simply given by way of example, and the present inventive concept is not limited thereto.

The solar cell 150 described above is electrically connected to a neighboring solar cell 150 by the wire 142, which is located over (e.g. in contact with) the first electrode 42 or the second electrode 44. This will be described below in more detail with reference to FIGS. 1 to 3 and FIG. 4.

Figure 4:
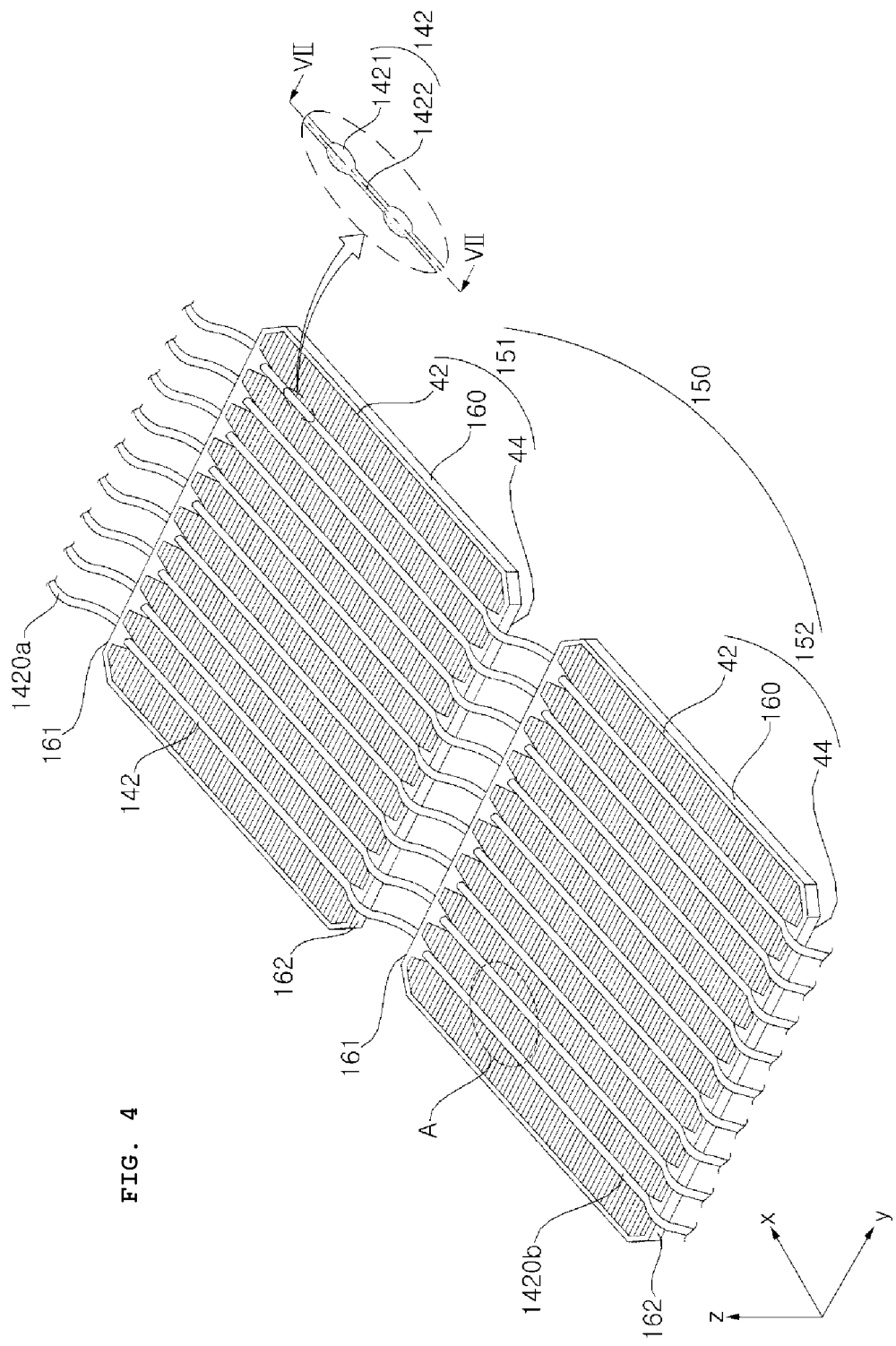
FIG. 4 is a perspective view schematically illustrating a first solar cell and a second solar cell, which are included in the solar cell panel of FIG. 1 and are connected to each other via the wires.

FIG. 4 is a perspective view schematically illustrating a first solar cell 151 and a second solar cell 152, which are included in the solar cell panel 100 of FIG. 1 and are connected to each other via the wire 142. In FIG. 4, the first and second solar cells 151 and 152 are schematically illustrated, and the illustration is focused on the semiconductor substrate 160 and the electrodes 42 and 44.

As illustrated in FIG. 4, two neighboring solar cells 150 (e.g. the first solar cell 151 and the second solar cell 152) among the solar cells 150 may be interconnected by the wire 142. At this time, the wire 142 interconnects the first electrode 42, which is disposed on the front surface of the first solar cell 151, and the second electrode 44, which is disposed on the back surface of the second solar cell 152, which is located on one side (the left lower side in FIG. 4) of the first solar cell 151. In addition, another wire 1420a interconnects the second electrode 44, which is disposed on the back surface of the first solar cell 151, and the first electrode 42, which is disposed on the front surface of another solar cell, which may be located on the other side (the right upper side in FIG. 4) of the first solar cell 151. In addition, another wire 1420b interconnects the first electrode 42, which is disposed on the front surface of the second solar cell 152, and the second electrode 44, which is disposed on the back surface of another solar cell, which may be located on one side (the left lower side in FIG. 4) of the second solar cell 152. In this way, the multiple solar cells 150 may be interconnected to form a single row by the wires 142, 1420a and 1420b. A following description related to the wire 142 may be applied to all of the wires 142, 1420a and 1420b, each of which interconnects two neighboring solar cells 150.

In the present embodiment, the wire 142 may include a first portion, a second portion, and a third portion. The first portion is connected to the first electrode 42 (more specifically, a bus-bar line (see reference numeral 42b in FIG. 5) of the first electrode 42) and extends a long length from a first edge 161 to a second edge 162, which is opposite the first edge 161. The second portion is connected to the second electrode 44 (more specifically, a bus-bar line of the second electrode 44) on the back surface of the second solar cell 152 and extends a long length from the first edge 161 to the second edge 162, which is opposite the first edge 161. The third portion extends from the front surface of the first solar cell 151 to the back surface of the second solar cell 152 so as to connect the first portion and the second portion to each other. As such, the wire 142 may cross a portion of the first solar cell 151, and then may cross a portion of the second solar cell 152. When the wire 142 has a width smaller than the first and second solar cells 151 and 152 and is formed so as to correspond to the portions of the first and second solar cells 151 and 152 (e.g. the bus-bar line 42b), the wire 142 may effectively interconnect the first and second solar cells 151 and 152 despite a small area thereof.

In one example, the wire 142 may come into contact with the bus-bar line 42b of the first and second electrodes 42 and 44 so as to extend a long length along the bus-bar line 42b. Thereby, the wire 142 and the first and second electrodes 42 and 44 may continuously come into contact with each other, which may improve electrical properties. However, the present inventive concept is not limited thereto. The first electrode 42 may have no bus-bar line 42b, and in this case, the wire 142 may be in contact with and be connected to a plurality of finger lines (see reference numeral 42a in FIG. 5) so as to cross the finger lines 42a. However, the present inventive concept is not limited thereto.

When viewing one surface of each solar cell 150, the multiple wires 142 may be provided to improve the electrical connection between neighboring solar cells 150. In particular, in the present embodiment, the wire 142 has a width smaller than a conventional ribbon having a relatively large width (e.g. within a range from 1 mm to 2 mm). As such, a greater number of wires 142 than the conventional ribbons (e.g. two to five wires) are used on one surface of each solar cell 150.

In one example, each wire 142 may include a core layer 142*a*, which is formed of a metal, and a solder layer 142*b*, which is coated over the surface of the core layer 142*a* at a small thickness and includes a solder material so as to enable soldering with the electrodes 42 and 44. In one example, the core layer 142*a* may include Ni, Cu, Ag or Al as a main material (e.g. a material included in an amount of 50 weight percent or more, more specifically, 90 weight percent or more). The solder layer 142*b* may include Pb, Sn, SnIn, SnBi, SnPb, SnPbAg, SnCuAg or SnCu as a main material. However, the present inventive concept is not limited thereto, and the core layer 142*a* and the solder layer 142*b* may include various other materials.

When the wire 142, which has a width smaller than the conventional ribbon, is used, material costs may be considerably reduced. In addition, because the wire 142 has a width smaller than the ribbon, a sufficient number of wires 142 may be provided to minimize the movement distance of carriers, which may enhance the output of the solar cell panel 100.

In addition, the wire 142 according to the present embodiment may include a rounded portion. That is, the wire 142 may have a circular, oval, or curvilinear cross section, or a rounded cross section. Thereby, the wire 142 may cause reflection or diffused reflection. In this way, light reflected from the rounded surface of the wire 142 may be reflected or totally reflected by the front substrate 110 or the back substrate 120, which is disposed on the front surface or the back surface of the solar cell 150, to thereby be reintroduced into the solar cell 150. This may effectively enhance the output of the solar cell panel 100. However, the present inventive concept is not limited thereto. Accordingly, the wire 142 may have a polygonal shape, such as a rectangular shape, or may have any of various other shapes.

In the present embodiment, the width (or the diameter) (see reference character W in FIG. 6) of the wire 142 before tabbing may range from 250 µm to 500 µm. For reference, in the present embodiment, because the thickness of the solder layer 142*b* may be very small and may have any of various values depending on the position of the wire 142 after tabbing, the width of the wire 142 may be the width (or the diameter) of the core layer 142*a*, which passes through the center, after tabbing. The wire 142 having the above-described width W may efficiently transfer current, generated in the solar cell 150, to an external circuit (e.g. a bus ribbon or a bypass diode of a junction box) or another solar cell 150. In the present embodiment, the wires 142 may be individually positioned over and fixed to the electrodes 42 and 44 of the solar cell 150 without being inserted into, for example, a separate layer or film. When the width W of the wire 142 is below 250 µm, the strength of the wire 142 may be insufficient and the connection area between the wire 142 and the electrodes 42 and 44 may be very small, which may result in poor electrical connection and low attachment force. When the width W of the wire 142 exceeds 500 µm, the cost of the wire 142 may increase, and the wire 142 may prevent light from being introduced into the front surface of the solar cell 150, thereby increasing shading loss. In addition, the wire 142 may receive force so as to be spaced apart from the electrodes 42 and 44, which may cause low attachment force between the wire 142 and the electrodes 42 and 44 and may generate cracks in the electrodes 42 and 44 or the semiconductor substrate 160. In one example, the width W of the wire 142 may range from 350 µm to 450 µm (more particularly, from 350 µm to 400 µm). With this range, the wire 142 may achieve increased attachment force for the electrodes 42 and 44 and may enhance the output of the solar cell panel 100.

Figure 6:
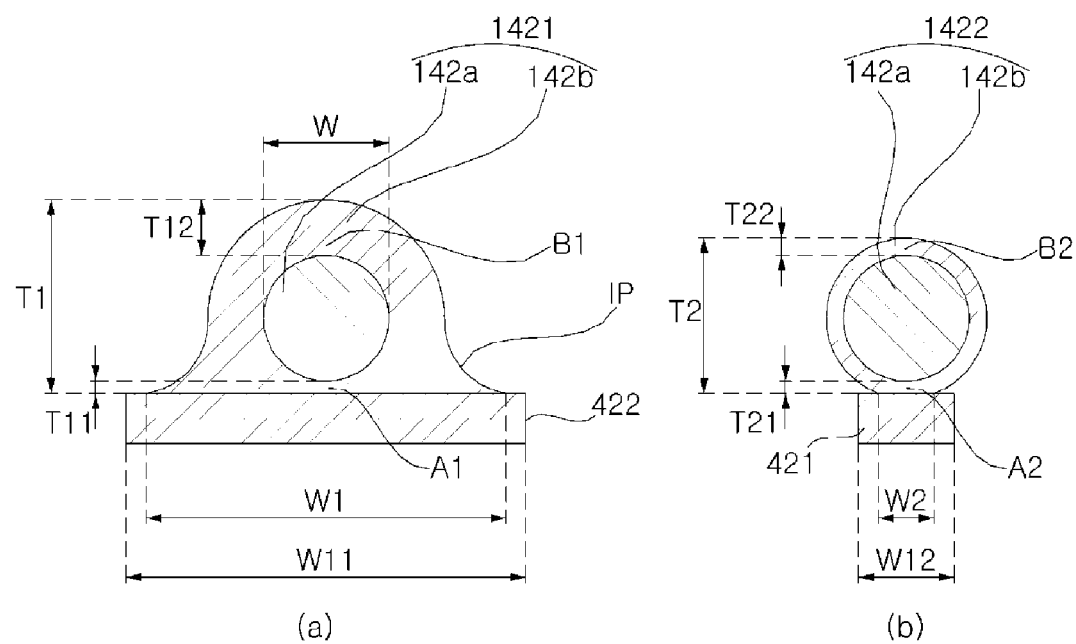
FIG. 6 is a sectional view taken in a direction perpendicular to the longitudinal direction of the wires illustrating a first wire portion and a second wire portion illustrated in FIG. 5.

In one example, in the wire 142 before tabbing, the thickness of the solder layer 142*b* has a small value of 20% or less (more specifically, 10% or less) of the width of the core layer 142*a* (e.g. 40 µm or less, specifically, within a range from 5 µm to 40 µm). At this time, when the thickness of the solder layer 142*b* is below 5 µm, tabbing may not be efficiently performed. When the thickness of the solder layer 142*b* exceeds 60 µm, material costs may increase and the width of the core layer 142*a* may be reduced, causing deterioration in the strength of the wire 142. In addition, after the wire 142 is attached to the solar cell 150 via tabbing, as illustrated in FIG. 6, for example, the thickness and the width of the solder layer 142*b* may be changed depending on the position. This will be described later in more detail.

At this time, six to thirty-three wires 142 may be provided on one surface of the solar cell 150. More specifically, when the width W of the wires 142 is 250 µm or more and below 300 µm, the number of the wires 142 may range from 15 to 33. When the width W of the wires 142 is 300 µm or more and below 350 µm, the number of the wires 142 may range from 10 to 33. When the width W of the wires 142 is 350 µm or more and below 400 µm, the number of the wires 142 may range from 8 to 33. When the width W of the wires 142 ranges from 400 µm to 500 µm, the number of the wires 142 may range from 6 to 33. In addition, when the width W of the wires 142 is 350 µm or more, the output of the solar cell panel 100 is no longer increased even if the number of the wires 142 exceeds 15. In addition, when the number of the wires 142 increases, this may increase burden on the solar cell 150. In consideration of this, when the width W of the wires 142 is 350 µm or more and below 400 µm, the number of the wires 142 may range from 8 to 15. When the width W of the wires 142 ranges from 400 µm to 500 µm, the number of the wires 142 may range from 6 to 15. At this time, in order to further enhance the output of the solar cell panel 100, the number of the wires 142 may be 10 or more (e.g. 12 or 13). However, the present inventive concept is not limited thereto, and the number of the wires 142 and the number of the bus-bar lines 42*b* may have various other values.

At this time, the pitch of the wires 142 (or the pitch of the bus-bar lines 42*b*) may range from 4.75 mm to 26.13 mm. This is acquired in consideration of the width W and the number of the wires 142. For example, when the width W of the wires 142 is 250 µm or more and below 300 µm, the pitch of the wires 142 may range from 4.75 mm to 10.45 mm. When the width W of the wires 142 is 300 µm or more and below 350 µm, the pitch of the wires 142 may range from 4.75 mm to 15.68 mm. When the width W of the wires 142 is 350 µm or more and below 400 µm, the pitch of the wires 142 may range from 4.75 mm to 19.59 mm. When the width W of the wires 142 ranges from 400 µm to 500 µm, the pitch of the wires 142 may range from 4.75 mm to 26.13 mm. More specifically, when the width W of the wires 142 is 350 µm or more and below 400 µm, the pitch of the wires 142 may range from 10.45 mm to 19.59 mm. When the width W of the wires 142 ranges from 400 µm to 500 µm, the pitch of the wires 142 may range from 10.45 mm to 26.13 mm.

However, the present inventive concept is not limited thereto, and the pitch of the wires 142 and the pitch of the bus-bar lines 42b may have various other values.

In the present embodiment, for example, the first electrode 42 (or the second electrode 44), the wire 142, and an electrode area (see reference character EA in FIG. 5) may be symmetrically arranged in the first direction (e.g. the direction parallel to the finger lines 42a) and the second direction (e.g. the direction parallel to the bus-bar lines 42b or the wires 142). Thereby, the flow of current may be stabilized. However, the present inventive concept is not limited thereto.

One example of the electrodes 42 and 44 of the solar cell 150 and the wires 142 attached thereto, which may be applied to the solar cell panel 100 according to the embodiment of the present inventive concept, will be described below in detail with reference to FIGS. 1 to 4 and FIGS. 5 to 7. For clear understanding, the wire 142 is illustrated by a one-dot dashed line. Hereinafter, the first electrode 42 will be described in detail with reference to FIG. 5, and then the second electrode 44 will be described.

Figure 5:
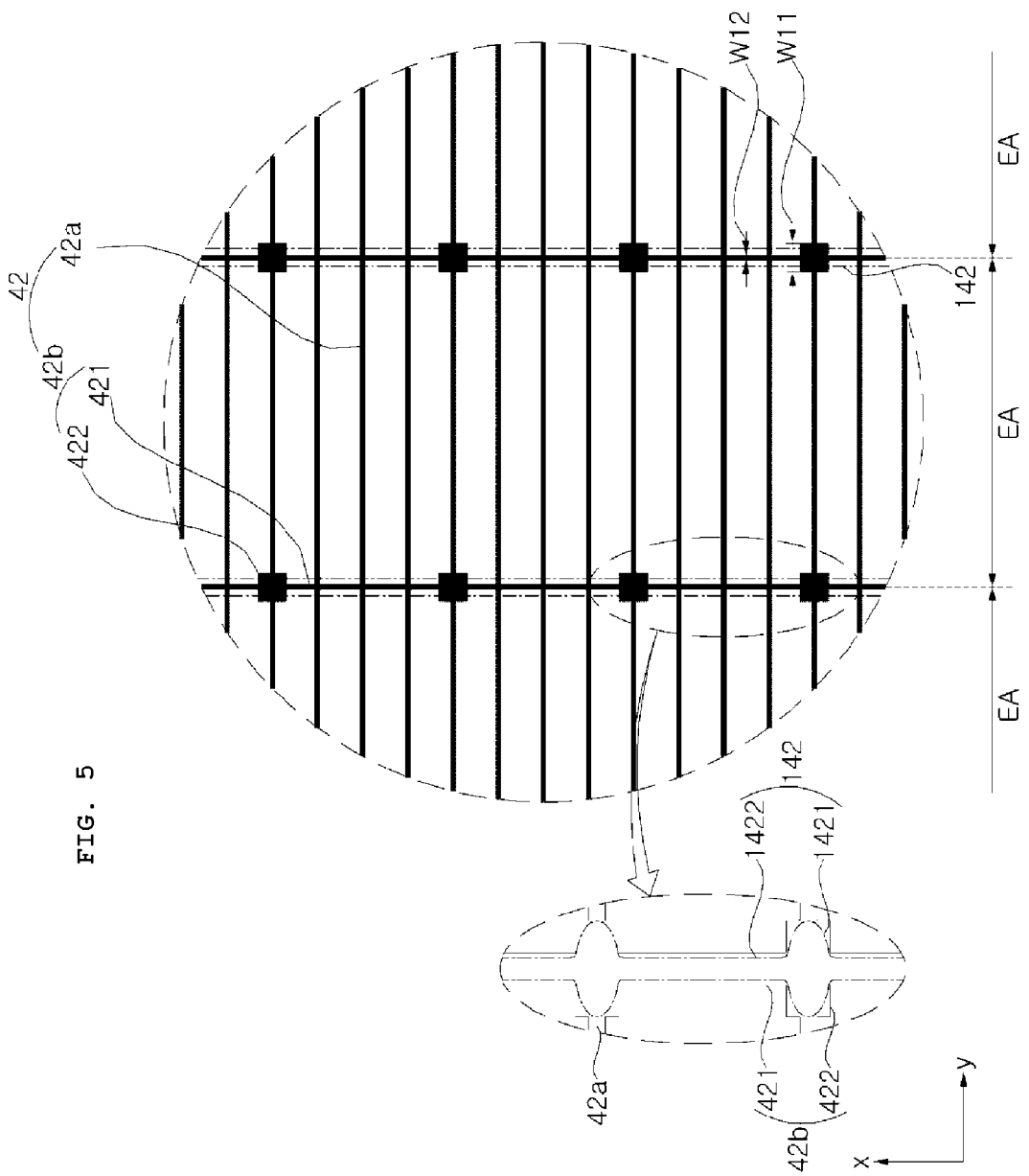
FIG. 5 is a partial plan view illustrating portion A of FIG. 4 in an enlarged scale.

FIG. 5 is a partial plan view illustrating portion A of FIG. 4 in an enlarged scale.

Referring to FIGS. 1 to 5, in the present embodiment, the first electrode 42 includes the finger lines 42a, which extend in the first direction (e.g. the horizontal direction in the drawings) and are arranged parallel to each other. The first electrode 42 may further include the bus-bar lines 42b, which extend in the second direction (e.g. the vertical direction in the drawings) crossing (e.g. perpendicular to) the finger lines 42a and are connected or attached to the wires 142. Because the bus-bar lines 42b may be arranged so as to correspond to the wires 142, the description related to the number and the pitch of the wires 142 may be directly applied to the number and the pitch of the bus-bar lines 42b. Hereinafter, an area between two neighboring bus-bar lines 42b among the bus-bar lines 42b or an area between the bus-bar line 42b and the edge of the solar cell 150 is referred to as the electrode area EA. In the present embodiment, because the multiple (e.g. six or more) wires 142 are provided on one surface of the solar cell 150, a plurality of electrode areas EA (provided in the number greater than the number of the wires 142 by one) may be provided.

The finger lines 42a may have a consistent width, and may be spaced apart from one another at a consistent pitch. Although FIG. 5 illustrates that the finger lines 42a are formed parallel to each other in the first direction and are parallel to the main edges (more particularly, the first and second edges 161 and 162) of the solar cell 150, the present inventive concept is not limited thereto.

In one example, the finger lines 42a of the first electrode 42 may have the width ranging from 35 μm to 120 μm and may have the pitch ranging from 1.2 mm to 2.8 mm, and the number of the finger lines 42a may range from 55 to 130 in the direction crossing the finger lines 42a. The width and the pitch of the finger lines 42a may be determined based on easy process conditions, and may be limited to minimize shading loss due to the finger lines 42a while ensuring the effective collection of current generated via photoelectric conversion. The thickness of the finger lines 42a may be within the range in which the finger lines 42a may be formed via an easy process and may have a desired specific resistance. However, the present inventive concept is not limited thereto, and the width and the pitch of the finger lines 42a may be changed in various ways depending on, for example, variation in process conditions, the size of the solar cell 150, and the constituent material of the finger lines 42a.

At this time, the width W of the wires 142 (more specifically, the width of the core layer 142a) may be smaller than the pitch of the finger lines 42a, and may be greater than the width of the finger lines 42a. However, the present inventive concept is not limited thereto, and various alterations are possible.

In one example, the bus-bar lines 42b may be successively formed from the position proximate to the first edge 161 to the position proximate to the second edge 162 on a per electrode area EA basis. As mentioned above, the bus-bar lines 42b may be located so as to correspond to the wires 142, which are used to connect the respective neighboring solar cells 150. The bus-bar lines 42b may correspond to the wires 142 in a one-to-one ratio. As such, in the present embodiment, the number of the bus-bar-lines 42b may be the same as the number of the wires 142 on one surface of the solar cell 150.

Each bus-bar line 42b may include a line portion 421, which has a relatively small width and extends a long length in the direction in which it is connected to the wire 142 within the electrode area EA, and a pad portion 422, which has a width greater than the line portion 421 so as to increase the area of connection for the wire 142. The line portion 421 having a small width may minimize the area by which light is blocked so as not to be introduced into the solar cell 150, and the pad portion 422 having a large width may increase the attachment force between the wire 142 and the bus-bar line 42b and may reduce contact resistance. The pad portion 422 has a width greater than the line portion 421, and thus substantially serves as a portion for the attachment of the wire 142. The wire 142 may be attached to the line portion 421, or may be simply placed on the line portion 421 without being attached thereto.

The width W11 of the pad portion 422, measured in the first direction, may be greater than the width of each of the line portion 421 and the finger line 42a.

The present embodiment exemplifies that the line portion 421 of the bus-bar line 42b is provided so as to correspond to the wire 142. More specifically, although a bus-bar electrode, which is significantly wider than the finger line 42a, is provided to correspond to the wire 142 in the related art, in the present embodiment, the line portion 421 of the bus-bar line 42b, which has a width significantly smaller than the bus-bar electrode, is provided. In the present embodiment, the line portion 421 may connect the finger lines 42a to one another so as to provide a bypass path for carriers when some finger lines 42a are disconnected.

In this specification, the bus-bar electrode refers to an electrode portion, which is formed in the direction crossing the finger lines so as to correspond to the ribbon and has a width twelve times or more (usually, fifteen times or more) the width of the finger lines. Two or three bus-bar electrodes are usually provided because the bus-bar electrodes have a relatively large width. In addition, in the present embodiment, the line portion 421 of the bus-bar line 42b may refer to an electrode portion, which is formed in the direction crossing the finger lines 42a so as to correspond to the wire 142 and has a width ten times or less the width of the finger line 42a.

In one example, the width W12 of the line portion 421 may range from 0.5 times to 10 times the width of the finger line 42a. When the ratio is below 0.5 times, the width W12 of the line portion 421 may be too small to allow the line portion 421 to exert sufficient effects. When the ratio exceeds 10 times, the width W12 of the line portion 421 may be excessive, causing increased shading loss. In particular, in the present embodiment, because a great number of wires 142 are provided, the line portions 421 are also provided in a great number, which may further increase shading loss. More specifically, the width W12 of the line portion 421 may range from 0.5 times to 7 times the width of the finger line 42a. When the ratio is 7 times or less, shading loss may further be reduced. In one example, in terms of shading loss, the width W12 of the line portion 421 may range from 0.5 times to 4 times the width of the finger line 42a. More specifically, the width W12 of the line portion 421 may range from 0.5 times to 2 times the width of the finger line 42a. With this range, the efficiency of the solar cell 150 may be greatly increased.

Alternatively, the width W12 of the line portion 421 may be equal to or smaller than the width W of the wire 142 (more specifically, the width W of the core layer 142a). This is because the width or area by which the lower surface of the wire 142 comes into contact with the line portion 421 is not large when the wire 142 has a circular, oval or rounded shape. When the line portion 421 has a relatively small width W12, the area of the first electrode 42 may be reduced, resulting in a reduction in the manufacturing costs of the first electrode 42.

In one example, the ratio of the width W of the wire 142 to the width W12 of the line portion 421 may be greater than 0.07 and less than 1. When the ratio is below 0.07, the width W12 of the line portion 421 is excessively small, causing deterioration in electrical properties. When the ratio exceeds 1, the area of the first electrode 42 is increased, causing increased shading loss and material costs without considerable improvement in the contact between the wire 142 and the line portion 421. In one example, the ratio may range from 1:01 to 1:0.5 (more specifically, from 1:0.1 to 1:0.3) when further considering the shading loss and the material costs.

Alternatively, the width W12 of the line portion 421 may be 490 μm or less (e.g. within a range from 30 μm to 350 μm). When the width W12 of the line portion 421 is below 350 μm, the width W12 of the line portion 421 is excessively small, causing deterioration in electrical properties. When the width W12 of the line portion 421 exceeds 350 μm (more particularly, exceeds 490 μm), the area of the first electrode 42 is excessive, causing increased shading loss and material costs without considerable improvement in the contact between the wire 142 and the line portion 421. In one example, the width W12 of the line portion 421 may range from 35 μm to 200 μm (more specifically, from 35 μm to 120 μm) when further considering the shading loss and the material costs.

Alternatively, the width W12 of the line portion 421 may be 36% or less (e.g. 25% or less) of the width W11 of the pad portion 422. This is limited to the range in which the attachment force between the pad portion 422 and the wire 142 may be increased and the shading loss by the line portion 421 may be minimized.

However, the present inventive concept is not limited thereto. Accordingly, the width W12 of the line portion 421 may be changed in various ways within the range in which the line portion 421 effectively transfers current generated via photoelectric conversion and minimizes shading loss. In addition, the line portion 421 may not be separately provided.

In addition, the width W11 of the pad portion 422 may be greater than the width W12 of the line portion 421, and may be equal to or greater than the width W of the wire 142. Because the pad portion 422 serves to increase force for the attachment of the wire 142 by increasing the contact area of the wire 142, the width of the pad portion 422 may be greater than the width of the line portion 421, and may be equal to or greater than the width of the wire 142.

In one example, the ratio of the width W of the wire 142 to the width W11 of the pad portion 422 may range from 1:1 to 1:5. When the ratio is below 1:1, the width W11 of the pad portion 422 may be insufficient, causing insufficient attachment force between the pad portion 422 and the wire 142. When the ratio exceeds 1:5, the area by which the pad portion 422 causes shading loss may be increased, resulting in greater shading loss. The ratio may range from 1:2 to 1:4 (more specifically, 1:2.5 to 1:4) when further considering the attachment force and the shading loss.

Alternatively, in one example, the width W11 of the pad portion 422 may range from 0.25 mm to 2.5 mm (e.g. from 0.5 mm to 2 mm). When the width W11 of the pad portion 422 is below 0.25 mm, the contact area between the pad portion 422 and the wire 142 may be insufficient, and consequently, the attachment force between the pad portion 422 and the wire 142 may be insufficient. When the width W11 of the pad portion 422 exceeds 2.5 mm, the area by which the pad portion 422 causes shading loss may be increased, resulting in greater shading loss. In one example, the width W11 of the pad portion 422 may range from 0.5 mm to 2 mm when further considering the attachment force between the wire 142 and the pad portion 422 and the shading loss.

In addition, the length of the pad portion 422 may be greater than the width of the finger line 42a. For example, the length of the pad portion 422 may range from 0.035 mm to 30 mm. When the length of the pad portion 422 is below 0.035 mm, the contact area between the pad portion 422 and the wire 142 may be insufficient, and consequently, the attachment force between the pad portion 422 and the wire 142 may be insufficient. When the length of the pad portion 422 exceeds 30 mm, the area by which the pad portion 422 causes shading loss may be increased, resulting in greater shading loss.

Alternatively, in one example, the ratio of the width of the finger line 42a to the length of the pad portion 422 may range from 1:1.1 to 1:20. With this range, the area for attachment between the pad portion 422 and the wire 142 may be increased, and consequently, the attachment force between the pad portion 422 and the wire 142 may be increased.

Alternatively, in one example, the ratio of the width W of the wire 142 to the length of the pad portion 422 may range from 1:1 to 1:10. When the ratio is below 1:1, the length of the pad portion 422 may be insufficient, causing insufficient attachment force between the pad portion 422 and the wire 142. When the ratio exceeds 1:10, the area by which the pad portion 422 causes shading loss may be increased, resulting in greater shading loss. The ratio may range from 1:3 to 1:6 when further considering the attachment force and the shading loss.

One bus-bar line 42b may include six to twenty-four pad portions 422 (e.g. twelve to twenty-two pad portions). The pad portions 422 may be spaced apart from one another. In one example, one pad portion 422 may be allotted to two to ten finger lines 42a. Thereby, the portion in which the contact area between the bus-bar line 42b and the wire 142 is increased is provided at a regular interval so as to increase the attachment force between the bus-bar line 42b and the wire 142. Alternatively, the pad portions 422 may be arranged so that distances between the respective two pad portions 422 have different values. In particular, the pad portions 422 may be arranged at a high density on the end of the bus-bar line 42b, to which greater force is applied than in the other portion (e.g. the central portion of the bus-bar line 42b). Various alterations are possible.

The above description has been focused on the first electrode 42 with reference to FIG. 5. The second electrode may include finger lines and bus-bar lines, which correspond respectively to the finger lines 42a and the bus-bar lines 42b of the first electrode 42. The description related to the finger lines 42a and the bus-bar lines 42b of the first electrode 42 may be applied to the finger lines and the bus-bar lines of the second electrode 44. At this time, the description of the first conductive area 20 in relation to the first electrode 42 may be the same as the description of the second conductive area 30 in relation to the second electrode 44. In addition, the description of the first passivation film 22, the anti-reflection film 24 and the opening 102 in relation to the first electrode 42 may be the description of the second passivation film 30 and the opening 104 in relation to the second electrode 44.

At this time, the widths W12 and W11, the pitch, and the number of the finger lines 42a of the first electrode 42 and the line portion 421 and the pad portion 422 of each bus-bar line 42b may be equal to the widths, the pitch, and the number of the finger lines of the second electrode 44 and the line portion and the pad portion of each bus-bar line. Alternatively, the widths W12 and W11, the pitch, and the number of the finger lines 42a of the first electrode 42 and the line portion 421 and the pad portion 422 of each bus-bar line 42b may differ from the widths, the pitch, and the number of the finger lines of the second electrode 44 and the line portion and the pad portion of each bus-bar line. In one example, the electrode portion of the second electrode 44, into which a relatively small amount of light is introduced, may have a width greater than the width of the electrode portion of the first electrode 42 corresponding thereto, and the pitch between the finger lines of the second electrode 44 may be less than the pitch of the finger lines 42a of the first electrode 42 corresponding thereto. Various alterations are possible. However, the number and the pitch of the bus-bar lines 42b of the first electrode 42 may be the same as to the number and the pitch of the bus-bar lines of the second electrode 44. In addition, the first electrode 42 and the second electrode 44 may have different planar shapes. For example, the second electrode 44 may be formed throughout the back surface of the semiconductor substrate 160. Various alterations are possible.

In the present embodiment, the wire 142, which interconnects the first solar cell 151 and the second solar cell 152, may be attached to the electrodes 42 and 44 via tabbing. When the wire 142 having the shape described above is provided, the output of the solar cell panel 100 may be increased. However, because the wire 142 has a reduced width compared to the related art, the attachment area between the wire 142 and the electrodes 42 and 44 may be reduced, which may result in insufficient attachment force. In addition, when the wire 142 (in particular, the core layer 142a) has a circular, oval, or curvilinear rounded cross-section, the attachment area between the electrodes 42 and 44 and the wire 142 may be further reduced, which may result in low attachment force between the electrodes 42 and 44 and the wire 142. In consideration of this, in the present embodiment, the connection between the electrodes 42 and 44 and the wire 142 may be increased and the reflection or diffused reflection by the wire 142 may be increased by controlling the shape of the bus-bar line 42b and the shape and connection structure of the wire 142 after tabbing. This will be described below in detail with reference to FIGS. 5 and 6. The following description is focused on the first electrode 42, and the same or similar description may be applied to the second electrode 44.

Figure 7:
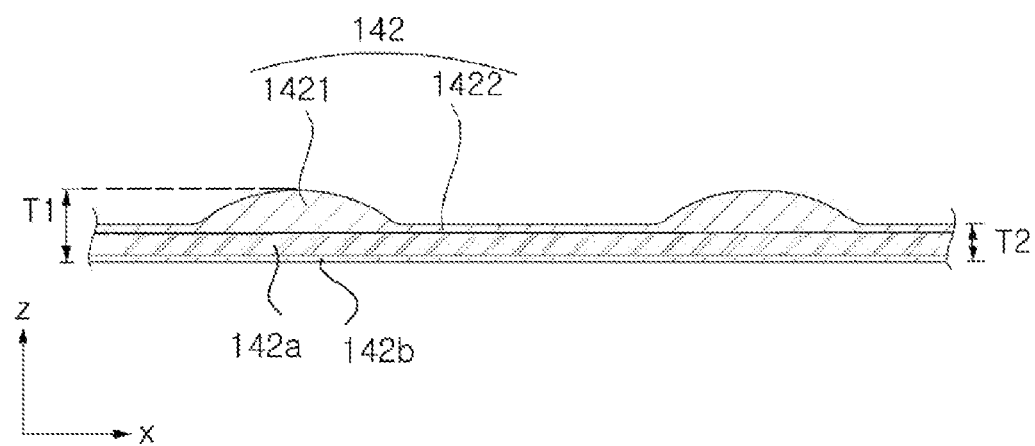
FIG. 7 is a schematic sectional view taken along line VII-VII of FIG. 4.
Figure 8:
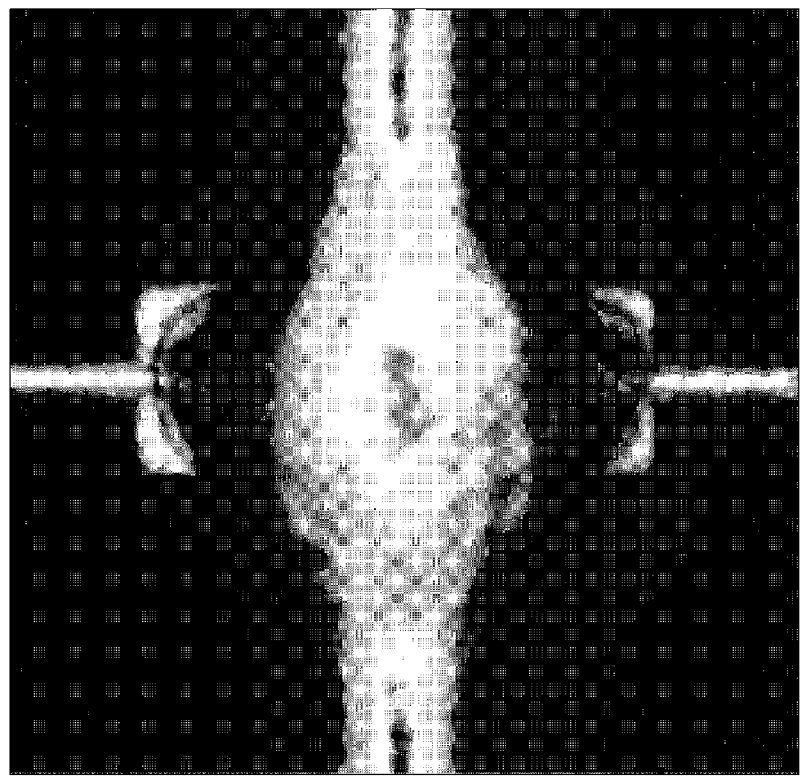
FIG. 8 is a photograph capturing a portion of a solar cell panel manufactured by attaching a wire to a bus-bar having a pad portion.

In FIG. 6, (a) is a sectional view taken in a direction perpendicular to the longitudinal direction of the wires 142 illustrating a first wire portion 1421, and (b) of FIG. 6 is a sectional view taken in a direction perpendicular to the longitudinal direction of the wires 142 illustrating a second wire portion 1422. FIG. 7 is a schematic sectional view taken along line VII-VII of FIG. 4. In addition, for reference, FIG. 8 is a photograph capturing a portion of an actual solar cell panel manufactured by attaching the wire 142 to the bus-bar line 42b having the pad portion 422. FIG. 6 is a sectional view taken in a direction perpendicular to the longitudinal direction of the wires illustrating the first wire portion and the second wire portion illustrated in FIG. 5.

In a tabbing process, for example, a soldering process of applying heat and pressure is performed in the state in which the wire 142, having a flux layer on the outer surface thereof, is disposed over the electrodes 42 and 44 (e.g. the bus-bar line 42b) of the solar cells 150. Then, as the solder layer 142b, which is formed of a solder material, is melted by heat and hardens, the wire 142 is fixed and attached to the electrodes 42 and 44. Thereby, the wire 142 is electrically connected and physically fixed to the electrodes 42 and 44. While the flux layer is used in order to prevent oxidation of the electrodes 42 and 44, the flux layer may not be essential and may be omitted.

At this time, the solder layer 142b has different wettability, depending on the solder material included therein, in the melted state thereof. That is, the solder layer 142b or the solder material has high wettability to the pad portion 422, which includes a metal as a main component, but has low wettability to the insulation layers (e.g. the first and second passivation films 22 and 32 and/or the anti-reflection film 24), which include an insulation material and configure the outer surface of the semiconductor substrate 160 or the solar cell 150 including a semiconductor material.

Accordingly, the melted solder material is gathered to and widely spreads over the pad portion 422 having the relatively large width W11, but will not be present over the line portion 421 having the relatively small width W12 (or the semiconductor substrate 160 or the insulation layer when the line portion 421 is not provided). In this way, after the soldering process is completed, a great amount of the melted solder material is condensed and hardens on the first wire portion 1421 of the wire 142, which is located over the pad portion 422, thereby forming the solder layer 142b. On the other hand, the solder layer 142b on a remaining area excluding the pad portion 422 (e.g. an area on the line portion 421 or between the pad portions 422) is formed when only a little amount of the melted solder material hardens. Accordingly, the first wire portion 1421 and the second wire portion 1422 have different shapes. In the present embodiment, by providing the bus-bar line 42b with the pad portion 422 having a large width, the attachment and reflection of the wire 142 using the properties of the solder layer 142b are improved. This will be described below in more detail.

Referring to FIGS. 6 to 8, the thickness T1 of the first wire portion 1421 is greater than the thickness T2 of the second wire portion 1422, and the upper surface of the first wire portion 1421 (e.g. the surface of the first wire portion 1421 located farther from the solar cell 150) is at the more outwardly convexly protruding position than the upper surface of the second wire portion 1422 (e.g. the surface of the second wire portion 1422 located farther from the solar cell 150).

In one example, the ratio of the thickness T2 of the second wire portion 1422 to the thickness T1 of the first wire portion 1421 may range from 1:1.05 to 1:1.5. In the present specification, the thickness T1 of the first wire portion 1421 may be the thickness of the thickest portion of the first wire portion 1421 (or the thickness of the first wire portion 1421 in the cross-section passing through the center of the pad portion 422), and the thickness T2 of the second wire portion 1422 may be the thickness of the thinnest portion of the second wire portion 1422 (or the thickness of the center of the second wire portion 1422, e.g. the center between two adjacent pad portions 422). When the ratio is below 1:1.05, the thickness of the first wire portion 1421 may be insufficient, which may cause deterioration in connection between the first wire portion 1421 and the pad portion 422 and may weaken improvement in reflection acquired by the first wire portion 1421. Because the width W (or the diameter or the thickness) of the core layer 142a is the same in the first wire portion 1421 and in the second wire portion 1422, the ratio may not exceed the value of 1:1.5. However, the present inventive concept is not limited thereto, and the ratio may have various values.

Alternatively, as described above, when the width W of the core layer 142a is within the range from 250 μm to 500 μm, the thickness T2 of the second wire portion 1422 may range from 250 μm to 580 μm and the thickness T1 of the first wire portion 1421 may range from 265.5 μm to 870 μm. This range is limited to the range within which the effect by the first wire portion 1421 may be improved in consideration of, for example, the thickness of the solder layer 142b and the width of the pad portion 422 before tabbing.

However, the present inventive concept is not limited as to, for example, the numerical ranges of the thickness T1 of the first wire portion 1421 and the thickness T2 of the second wire portion 1422 and the ratio thereof.

At this time, because the thicknesses of the core layer 142a of the first wire portion 1421 and the core layer 142a of the second wire portion 1422 are the same or extremely similar to each other, the thickness of the solder layer 142b of the first wire portion 1421 may be greater than the thickness of the solder layer 142b of the second wire portion 1422. Here, the thickness of the solder layer 142b of the first wire portion 1421 is the sum of the thicknesses of the solder layers 142b in the thickest portion of the first wire portion 1421. In addition, the thickness of the solder layer 142b of the second wire portion 1422 is the sum of the thicknesses of the solder layers 142b in the thinnest portion of the second wire portion 1422.

At this time, the core layer 142a of the first wire portion 1421 may come into contact with and be attached to the pad portion 422. Alternatively, although a first lower portion A1 of the solder layer 142b may remain between the core layer 142a of the first wire portion 1421 and the pad portion 422, the thickness of the first lower portion A1 may not be great. For example, the thickness T11 of the first lower portion A1 may be 10 μm or less (e.g. 5 μm or less, more specifically, 1 μm or less). This is because a portion of the melted solder material adjacent to the pad portion 422 has high wettability to the pad portion 422, and therefore the melted solder material hardens in the state in which it spreads throughout the pad portion 422 over the entire area of the pad portion 422. In addition, because the wire 142 is pressed to the solar cell 150 during tabbing in order to improve attachment to the solar cell 150, the first lower portion A1 is not provided, or has a small thickness.

In addition, a first upper portion B1 of the solder layer 142b of the first wire portion 1421, which is located above the core layer 142a at a position distant from the solar cell 150, may have a thickness T12 greater than the thickness T11 of the first lower portion A1. Because the first lower portion A1 is not provided, or has a small thickness as described above, most of the melted solder material condensed over the pad portion 422 is located in the first upper portion B1. Thereby, the first upper portion B1 has an outwardly convexly protruding curved surface. This will be described later in more detail. In one example, the thickness T12 of the first upper portion B1 may range from 12.5 μm to 290 μm.

In addition, the core layer 142a of the second wire portion 1422 may come into contact with and be attached to the line portion 421, or may be simply placed in contact with the line portion 421 without being fixed thereto. Alternatively, although a second lower portion A2 of the solder layer 142b may remain between the core layer 142a of the second wire portion 1422 and the line portion 421, the thickness of the second lower portion A2 may not be great. For example, the thickness T21 of the second lower portion A2 may be 10 μm or less (e.g. 5 μm or less, more specifically, 1 μm or less). This is because, once the solder material under the core layer 142a of the second wire portion 1422 has been melted, the solder material moves to the pad portion 422 having high wettability to thereby be condensed on the pad portion 422, and therefore, only a little amount of the solder material remains and hardens on the line portion 421. In addition, because the wire 142 is pressed to the solar cell 150 during tabbing in order to improve attachment to the solar cell 150, the second lower portion A2 is not provided, or has a small thickness.

In addition, a second upper portion B2 of the solder layer 142b of the second wire portion 1422, which is located above the core layer 142a at a position distant from the solar cell 150, may have a thickness T22 equal to or greater than the thickness T21 of the second lower portion A2. This is because the solder layer 142b in the upper portion of the second wire portion 1422 is melted and moves down to the pad portion 422 and because the solder material may show a lower flow rate in the upper portion than in the lower portion of the second wire portion 1422. In one example, the thickness of the solder layer 142b in the upper portion may be 40 μm or less (e.g. 10 μm or less).

In addition, the thickness T22 of the second upper portion B2 may be less than the thickness T12 of the first upper portion B1. This is because the melted material may be condensed in the first upper portion B1 so that the first upper portion B1 has a greater thickness than the second upper portion B2 as described above. Because the first lower portion B1 and the second lower portion B2 are not formed, or have only a small thickness as described above, a difference between the first thickness T1 of the first wire portion 1421 and the second thickness T2 of the second wire portion 1422 may be practically a difference between the thickness T12 of the first upper portion B1 and the thickness T22 of the second upper portion B2. Accordingly, for example, the difference between the thickness T12 of the first upper portion B1 and the thickness T22 of the second upper portion B2 may range from 12.5 μm to 290 μm.

However, the present inventive concept is not limited as to, for example, the numerical ranges of the thickness T11 of the first lower portion B1, the thickness T12 of the first upper portion B1, the thickness T21 of the second lower portion A2, and the thickness T22 of the second upper portion B2, and the ratios thereof.

The case where the line portion 421 is provided has been described above by way of example. However, only the finger line 42a may be located between the pad portions 422 without the line portion 421, or the finger line 42a may also be omitted. In this case, the core layer 142a of the second wire portion 1422 may come into contact with the finger line 42a, the insulation layer or the like, or the second lower portion B2 having a small thickness may remain over the finger line 42a or the insulation layer.

In addition, when viewing in the cross section perpendicular to the longitudinal direction, a portion of the first wire portion 1421, which is located distant from the solar cell 150, has an increasing width with decreasing distance to the solar cell 150 depending on the shape of the core layer 142a. A portion of the first wire portion 1421, which is located close to the solar cell 150, also has an increasing width because the solder layer 142b is formed as the melted solder material hardens in the state in which it spreads laterally.

More specifically, in the cross section of the first wire portion 1421 perpendicular to the longitudinal direction, the portion located distant from the solar cell 150 may have an outwardly convexly protruding curved surface. In one example, in the cross section of the first wire portion 1421 perpendicular to the longitudinal direction, the portion located distant from the solar cell 150 may have an approximately semicircular or semielliptical shape. As such, light is reflected or diffusely reflected by the convexly protruding portion of the first wire portion 1421 so as to be directed to the front substrate 110, and then is totally reflected by the front substrate 110 so as to be again directed to the solar cell 150. In this way, the light may be reused, resulting in an increase in illuminance.

In addition, in the cross section of the first wire portion 1421 perpendicular to the longitudinal direction, the portion close to the solar cell 150 may have an outwardly concave curved surface and may have an increasing width with decreasing distance to the solar cell 150. Thereby, an inflection point IP is located between the portion close to the solar cell 150 and the portion distant from the solar cell 150 in the cross section of the first wire portion 1421 perpendicular to the longitudinal direction. This is because the melted solder material hardens in the state in which it spreads over most of the entire area of the pad portion 422. However, the present inventive concept is not limited thereto, and the cross section of the first wire portion 1421 may have various shapes.

At this time, the first width W1 of the first wire portion 1421 in the portion close to the solar cell 150 (e.g. the portion in contact with the electrodes 42 and 44) may have a large value, which is similar to the width W11 of the pad portion 422, and thus may be greater than the width W of the core layer 142a.

In one example, the first width W1 of the first wire portion 1421 may be greater than the width W12 of the line portion 421, and may be equal to or smaller than the width W11 of the pad portion 422. For example, the first width W1 of the first wire portion 142 may range from 0.25 mm to 2.5 mm (e.g. from 0.5 mm to 2 mm). This is because the melted solder material has low wettability to the semiconductor substrate 160 or the insulation layer, and therefore does not well move out of the pad portion 422 as described above. However, the present inventive concept is not limited thereto.

When viewing the first wire portion 1421 in plan, as illustrated in the enlarged circle of FIG. 5, the first wire portion 1421 may have a circular, elliptical or rounded shape that occupies most of the pad portion 422.

In addition, when viewing in the cross section perpendicular to the longitudinal direction, a portion of the second wire portion 1422, which is located distant from the solar cell 150, has an increasing width with decreasing distance to the solar cell 150 depending on the shape of the core layer 142a. A portion of the second wire portion 1422, which is located close to the solar cell 150, has a decreasing width with decreasing distance to the solar cell 150, so as to correspond to the shape of the core layer 142a. This is because the width W12 of the line portion 421 is less than the width W of the core layer 142a, and therefore the melted solder material hardens in the state in which it moves to the pad portion 422 close to the corresponding line portion 421 and is not present over the semiconductor substrate 160 or the insulation layer around the line portion 421.

In one example, when viewed in the cross section perpendicular to the longitudinal direction, the outer surface of the second wire portion 1422 may wholly have a rounded shape defined by a convexly curved surface. For example, the outer surface of the second wire portion 1422 may configure a portion of an approximately circular or elliptical shape. In addition, the planar shape of the second wire portion 1422 may be an elongated line having an even width as illustrated in the enlarged circle of FIG. 5.

At this time, the second width W2 of the portion of the second wire portion 1422, located close to the solar cell 150 (e.g. located in contact with the electrodes 42 and 44), may have a small value, which is similar to the width W12 of the line portion 421, and thus may be less than the width W of the core layer 142a.

In one example, the second width W2 of the second wire portion 1422 may be equal to or smaller than the width W12 of the line portion 421. For example, the second width W2 of the second wire portion 1422 may be 490 μm or less (e.g. within a range from 30 μm to 350 μm). This is because the solder material has low wettability to the semiconductor substrate 160, and thus does not well move out of the line portion 421 as described above. However, the present inventive concept is not limited thereto.

Accordingly, the first width W1 of the first wire portion 1421 may be greater than the second width W2 of the second wire portion 1422. For example, the second width W2 of the second wire portion 1422 may be 36% or less (e.g. 25% or less) of the first width W1 of the first wire portion 1421. This is limited to a value acquired in consideration of the width W11 of the pad portion 422 and the width W12 of the line portion 421.

In the present embodiment, the thickness T1 of the first wire portion 1421 may be less than the first width W1 of the first wire portion 1421. When the first width W1 of the first wire portion 1421 is equal to or less than the thickness T1 of the first wire portion 1421, stress applied to the solar cell 150 is increased at the position to which the first wire portion 1421 is attached, which may cause defects or cracks.

In one example, the ratio of the first width W1 of the first wire portion 1421 to the thickness T1 of the first wire portion 1421 may range from 1:0.3 to 1:0.6. When the ratio exceeds 1:0.6, stress applied to the solar cell 150 is increased at the position to which the first wire portion 1421 is attached, which may cause defects or cracks. When the ratio is below 1:0.3, the thickness T1 of the first wire portion 1421 is insufficient, causing insufficient connection between the first wire portion 1421 and the electrodes 42 and 44. However, the present inventive concept is not limited thereto, and the ratio may have various values.

When the thickness T1 of the first wire portion 1421 located in the pad portion 422, which has a greater width than the line portion 421 and substantially serves as a portion to which the wire 142 is attached, has a great value, the volume of the wire 142 located over the pad portion 422 may be maximized. Thereby, the attachment between the pad portion 422 and the wire 142 may be improved, and the contact resistance may be reduced. In addition, the first wire portion 1421 located over the pad portion 422 may have a relatively great diameter, first width W1 or thickness attributable to condensation, which may improve reflection or diffused reflection by the first wire portion 1421. In this way, the output of the solar cell panel 100 may be improved.

The above described features, configurations, effects, and the like are included in at least one of the embodiments of the present inventive concept, and should not be limited to only one embodiment. In addition, the features, configurations, effects, and the like as illustrated in each embodiment may be implemented with regard to other embodiments as they are combined with one another or modified by those skilled in the art. Accordingly, reference to various alterations being possible refers to various modifications or embodiments that may be made. Thus, content related to these combinations and modifications should be construed as including in the scope and spirit of the inventive concept as disclosed in the accompanying claims.

What is claimed is:
1. A solar cell panel comprising:
a plurality of solar cells each including a semiconductor substrate and an electrode formed on the semiconductor substrate; and
a wire for interconnecting at least two of the plurality of solar cells,
wherein the electrode includes a bus-bar line having a pad portion for attachment of the wire,
wherein the wire includes a first wire portion connected to the pad portion, and a second wire portion located on a portion of the bus-bar line excluding the pad portion,
wherein the first wire portion has a thickness greater than a thickness of the second wire portion, and
wherein the first wire portion close to each of the plurality of solar cells has a width greater than a width of the second wire portion close to each of the plurality of solar cells.

2. The solar cell panel according to claim 1, wherein a ratio of the thickness of the second wire portion to the thickness of the first wire portion ranges from 1:1.05 to 1:1.5.

3. The solar cell panel according to claim 1, wherein the thickness of the first wire portion is less than a width of the first wire portion close to the pad portion.

4. The solar cell panel according to claim 3, wherein a ratio of the width of the first wire portion close to the pad portion to the thickness of the first wire portion ranges from 1:0.3 to 1:0.6.

5. The solar cell panel according to claim 1, wherein the wire includes a core layer and a solder layer disposed on an outer surface of the core layer, and
wherein the solder layer of the first wire portion has a thickness greater than a thickness of the solder layer of the second wire portion.

6. The solar cell panel according to claim 5, wherein the solder layer is not provided in the first wire portion between the core layer and the pad portion, or the solder layer includes a lower portion located between the core layer and the pad portion and an upper portion located distant from the solar cells, a thickness of the lower portion being less than a thickness of the upper portion.

7. The solar cell panel according to claim 5, wherein the solder layer of the first wire portion includes an upper portion located distant from the solar cells, the solder layer of the second wire portion includes an upper portion located distant from the solar cells, and the upper portion of the solder layer of the first wire portion has a thickness greater than a thickness of the upper portion of the solder layer of the second wire portion.

8. The solar cell panel according to claim 5, wherein the core layer has a circular or elliptical cross-sectional shape.

9. The solar cell panel according to claim 5, wherein the core layer has a width ranging from 250 μm to 500 μm,
wherein the thickness of the first wire portion ranges from 265.5 μm to 870 μm, and
wherein the thickness of the second wire portion ranges from 250 μm to 580 μm.

10. The solar cell panel according to claim 1, wherein the first wire portion is gradually increased in width, in a portion thereof close to the solar cells, with decreasing distance to the solar cells, and
wherein the second wire portion is gradually reduced in width, in a portion thereof close to the solar cells, with decreasing distance to the solar cells.

11. The solar cell panel according to claim 1, wherein, in a cross-section of the first wire portion perpendicular to a longitudinal direction, an inflection point is located between a portion located distant from the solar cells and a portion located close to the solar cells.

12. The solar cell panel according to claim 1, wherein, in a cross-section of the first wire portion perpendicular to a longitudinal direction, a portion located distant from the solar cells has an outwardly convexly curved outer surface.

13. The solar cell panel according to claim 12, wherein, in the cross-section of the first wire portion perpendicular to the longitudinal direction, the portion located distant from the solar cells has a semicircular or semielliptical shape.

14. The solar cell panel according to claim 1, wherein the width of the second wire portion close to the solar cells is 36% or less of the width of the first wire portion close to the solar cells.

15. The solar cell panel according to claim 1, wherein the electrode further includes a line portion having a smaller width than the pad portion,
wherein the second wire portion is located over the line portion,
wherein the wire includes a core layer and a solder layer disposed on an outer surface of the core layer, and
wherein the core layer has a diameter greater than the width of the line portion.

16. The solar cell panel according to claim 15, wherein the first wire portion close to the solar cells has a width equal to or less than the width of the pad portion and greater than the width of the line portion.

17. The solar cell panel according to claim 15, wherein the second wire portion close to the solar cells has a width equal to or less than the width of the line portion.

18. The solar cell panel according to claim 15, wherein the width of the line portion is below 490 μm, and
wherein the width of the pad portion ranges from 0.5 mm to 2 mm.

19. The solar cell panel according to claim 1, wherein the wire is provided in a number ranging from six to thirty-three on one surface of each solar cell.

20. A solar cell panel comprising:
a plurality of solar cells each including a semiconductor substrate and an electrode formed on the semiconductor substrate; and a wire for interconnecting at least two of the plurality of solar cells,
wherein the electrode includes a bus-bar line having a pad portion for attachment of the wire,
wherein the wire includes a first wire portion connected to the pad portion, and a second wire portion located on a portion of the bus-bar line excluding the pad portion,
wherein the first wire portion has a thickness greater than a thickness of the second wire portion,
wherein the wire includes a core layer and a solder layer disposed on an outer surface of the core layer, and
wherein the solder layer of the first wire portion has a thickness greater than a thickness of the solder layer of the second wire portion.

* * * * *